(12) United States Patent
Saitou et al.

(10) Patent No.: US 9,859,864 B2
(45) Date of Patent: Jan. 2, 2018

(54) NOISE FILTER AND HARNESS

(71) Applicant: YAZAKI CORPORATION, Tokyo (JP)

(72) Inventors: Hideaki Saitou, Makinohara (JP); Atsushi Nakata, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 221 days.

(21) Appl. No.: 14/709,596

(22) Filed: May 12, 2015

(65) Prior Publication Data
US 2015/0333720 A1 Nov. 19, 2015

(30) Foreign Application Priority Data
May 13, 2014 (JP) .................................. 2014-099854

(51) Int. Cl.
*H03H 7/09* (2006.01)
*H03H 7/01* (2006.01)
(Continued)

(52) U.S. Cl.
CPC ............. *H03H 7/09* (2013.01); *H01F 27/33* (2013.01); *H01F 27/40* (2013.01); *H03H 1/00* (2013.01); *H03H 1/0007* (2013.01); *H03H 7/0115* (2013.01); *H03H 7/0123* (2013.01); *H03H 7/1716* (2013.01); *H03H 7/1725* (2013.01); *H03H 7/1758* (2013.01); *H03H 2001/005* (2013.01); *H04B 1/10* (2013.01)

(58) Field of Classification Search
CPC ...... H03H 7/0115; H03H 7/09; H03H 1/0007; H03H 7/0123; H04R 3/022

USPC ........................................... 333/181, 185, 12
See application file for complete search history.

(56) References Cited

U.S. PATENT DOCUMENTS

| 2012/0081194 A1 | 4/2012 | Nishioka et al. |
| 2014/0102782 A1 | 4/2014 | Toyama |
| 2015/0296298 A1* | 10/2015 | Yamada ............... H03H 7/0115 381/71.1 |

FOREIGN PATENT DOCUMENTS

| CN | 103703642 A | 4/2014 |
| DE | 1990970 U | 8/1968 |

(Continued)

OTHER PUBLICATIONS

Office Action dated Aug. 18, 2015, issued by the German Patent and Trademark Office in counterpart German Patent Application No. 10 2015 208 815.4.

(Continued)

*Primary Examiner* — Rakesh Patel
(74) *Attorney, Agent, or Firm* — Sughrue Mion, PLLC

(57) ABSTRACT

A noise filter includes a filter device and a filter retainer. The filter device includes a device unit having at least one capacitor provided therein, an input side lead wire extending from the device unit, an output side lead wire extending from the device unit, and a ground connection portion provided on the device unit. The filter device forms the noise filter that uses a mutual inductance between the input side lead wire and the output side lead wire. The filter retainer has a holding structure configured to maintain an arrangement of the input side lead wire and the output side lead wire. The arrangement forms an overlapping section in which the lead wires are closely opposed to each other. The noise filter may be attached to a harness.

7 Claims, 9 Drawing Sheets

(51) Int. Cl.
*H03H 1/00* (2006.01)
*H01F 27/33* (2006.01)
*H01F 27/40* (2006.01)
*H04B 1/10* (2006.01)

(56) References Cited

FOREIGN PATENT DOCUMENTS

| | | |
|---|---|---|
| JP | 03-225905 A | 10/1991 |
| JP | 2011-146782 A | 7/2011 |
| JP | 2012-105081 A | 5/2012 |

OTHER PUBLICATIONS

Office Action dated Jul. 4, 2017 by the State Intellectual Property Office of PR China in counterpart Chinese patent application No. 201510243781.1.

* cited by examiner

NOISE FILTER AND HARNESS

CROSS-REFERENCE TO RELATED APPLICATIONS

The present application claims priority from Japanese Patent Application No. 2014-099854 filed on May 13, 2014, the entire content of which is incorporated herein by reference.

FIELD OF INVENTION

The present invention relates to a noise filter adapted, for example, to reduce radio-frequency noise in a frequency band of an AM radio broadcasting, and a harness having the noise filter.

RELATED ART

When receiving a medium wave broadcast, e.g., an amplitude modulation (AM) broadcast in a frequency band of 520 kHz to 1650 kHz, with an in-vehicle radio receiver, the frequency of the radio-frequency noise caused by a device on the vehicle may overlap the frequency band of the broadcast, in which case the radio-frequency noise is received by the antenna of the in-vehicle radio receiver, the noise is mixed into the received broadcast, and noise appears in the sound output from the speaker.

An example of the noise source is a rear defogger (a dew condensation prevention device for rear windows) of a car. That is, when the switch of the rear defogger is turned on and off and a major change occurs in the current flowing from the power source to the load (hot wire), radio-frequency current is generated, and electromagnetic waves resulting from this radio-frequency current are radiated to the outside by way of the power-supply line or the like and received as radio-frequency noise by the antenna of the radio disposed in the neighborhood of the rear defogger. Accordingly, to reduce the radiation of the radio-frequency noise, it is common practice to provide a noise filter along the power-supply line that can be a noise source.

JP3-225905A and JP2011-146782A disclose noise filters that can be used for such purpose.

The noise filter of JP2011-146782A uses a filter device having a structure as shown in FIGS. 13A and 13B. This filter device has one capacitor in appearance as shown in FIG. 13A. This capacitor, having a residual inductance inside, equivalently forms a circuit in which a capacitance component and a residual inductance component (L) of one capacitor are connected in series, and is configured as a self-resonant trap filter. That is, since the resistance value of the circuit is reduced in the vicinity of the resonance frequency, by connecting this noise filter between the power-supply line and the ground, only the radio-frequency noise component in the vicinity of the resonance frequency is filtered out, so that the radiated electromagnetic waves (noise) are reduced.

To reduce noise over a wide frequency band, according to JP2011-146782A, the input side line and the output side line of the filter device are arranged to intersect to form a loop as shown in FIG. 14. The electric circuit of the noise filter shown in FIG. 14 is shown in FIG. 15A, and its equivalent circuit is shown in FIG. 15B.

The noise filter shown in FIG. 14 is configured to have a loop, so that an overlapping section where the input side line and the output side line of the filter device are closely opposed to each other is provided in the region where they intersect. In this overlapping section, a mutual inductance is generated between the input side line and the output side line, and this mutual inductance changes the inductance of the resonance circuit forming the noise filter. Therefore, by adjusting the length of the overlapping section, the frequency characteristics of the noise filter can be adjusted and desired frequency characteristics can be obtained.

However, it is not easy to adjust the length of the overlapping section to obtain desired frequency characteristics. For example, the input side line and the output side line may be fixed by winding a tape around the peripheries thereof in order to fix the relative positional relationship therebetween at the overlapping section. However, in this case, it is only the number of times of winding of the tape and the length of the area wound by the tape that can be adjusted, so that the length of the overlapping section cannot be adjusted precisely. When the arrangement of the lines forming the loop is thus changed, a change occurs in the mutual inductance characteristics and this changes the frequency characteristics of the noise filter.

In particular, since the number of times of winding of the tape and the length of the area wound by the tape are apt to vary in the manufacturing process, it is difficult to adjust the length of the overlapping section by a method of winding the tape. Consequently, when tape is wound for the adjustment described above, it is difficult to provide uniform characteristics of the noise filter.

SUMMARY

Illustrative aspects of the present invention provide a noise filter and a harness with uniform frequency characteristics of the noise filter.

According to an aspect of the present invention, a noise filter is provided. The noise filter includes a filter device and a filter retainer. The filter device includes a device unit having at least one capacitor provided therein, an input side lead wire extending from the device unit, an output side lead wire extending from the device unit, and a ground connection portion provided on the device unit. The filter device forms the noise filter that uses a mutual inductance between the input side lead wire and the output side lead wire. The filter retainer has a holding structure configured to maintain an arrangement of the input side lead wire and the output side lead wire. The arrangement forms an overlapping section in which the input side lead wire and the output side lead wire are closely opposed to each other.

According to another aspect of the present invention, a harness is provided. The harness includes the noise filter described above and a set of electric wires. A portion of the input side lead wire located farther away from the device unit than the overlapping section and a portion of the output side lead wire located farther away from the device unit than the overlapping section are tied to the set of electric wires.

Other aspects and advantages of the invention will be apparent from the following description, the drawings and the claims.

DETAILED DESCRIPTION

Hereinafter, exemplary embodiments of the present invention will be described in detail with reference to the drawings.

Figure 1:
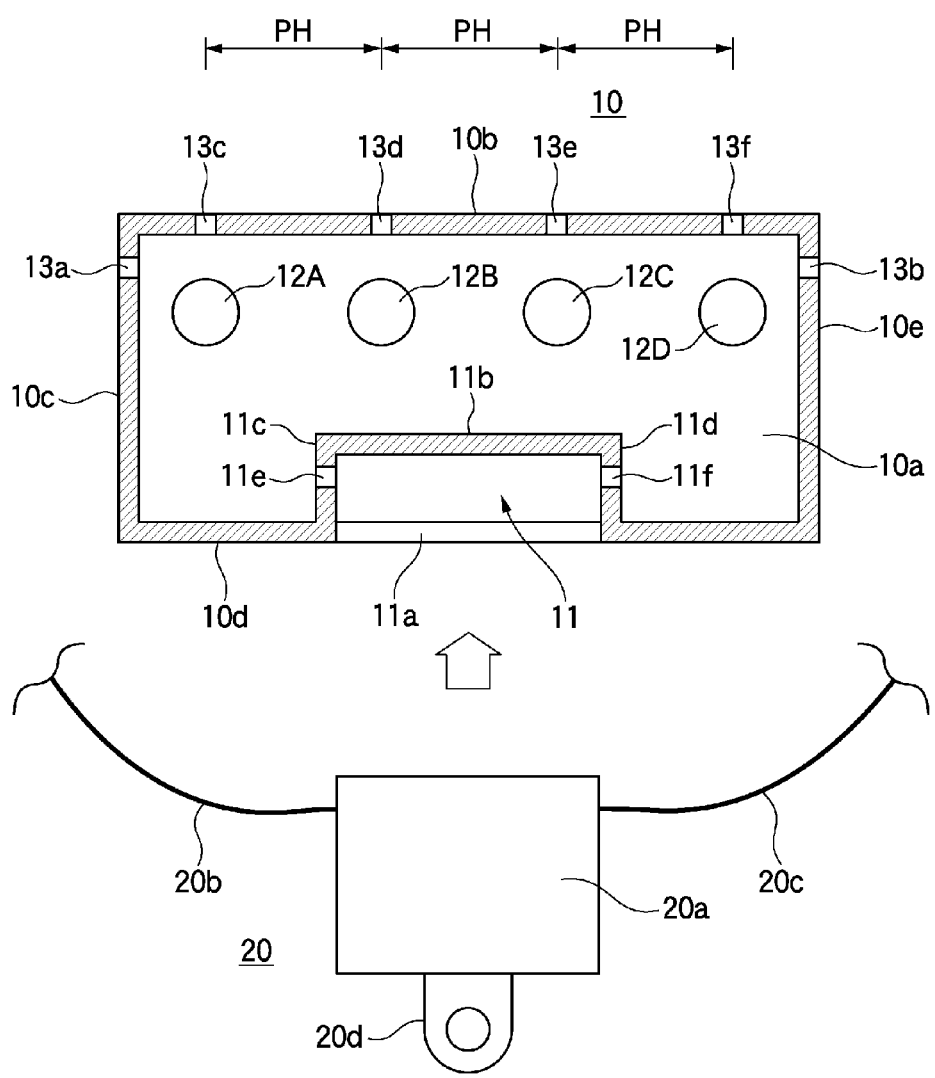
FIG. 1 is a longitudinal cross-sectional view illustrating a protector and a filter device of a noise filter according to an embodiment of the present invention.

FIG. 1 illustrates configurations of a protector 10 and a filter device 20 of a noise filter according to an embodiment of the present invention. The noise filter of the present embodiment includes the protector 10 and the filter device 20.

The protector 10 (an example of a filter retainer) shown in FIG. 1 is configured to protect the filter device 20 and also to provide uniform frequency characteristics of the filter device 20. Specifically, the protector 10 accommodates a portion (a device unit 20a) of the filter device 20 in the internal space thereof, and is used for maintaining the relative positional relationship among the device unit 20a, a lead wire 20b and a lead wire 20c and the configuration and wiring routes of the lead wire 20b and the lead wire 20c in a desired condition.

Figure 13A:
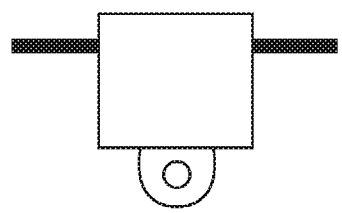
FIG. 13A is a front view of an outer appearance of an example of a filter device.
Figure 13B:
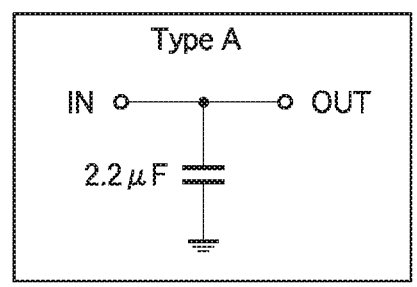
FIG. 13B is an electric circuit diagram of the filter device.
Figure 14:
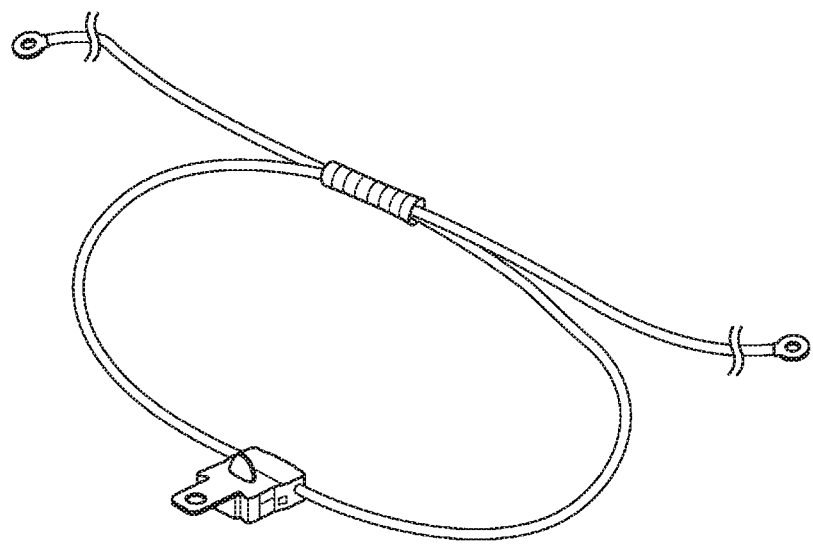
FIG. 14 is a perspective view of a related art noise filter having a loop structure.
Figure 15A:
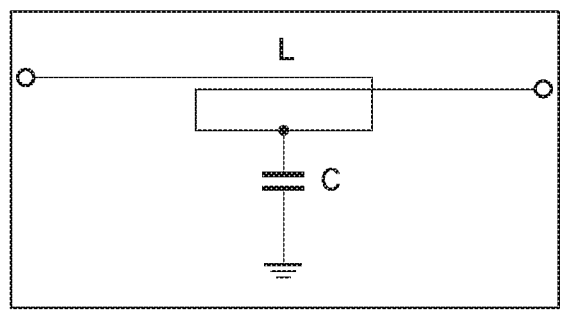
FIG. 15A is an electric circuit diagram of the noise filter of FIG. 14.
Figure 15B:
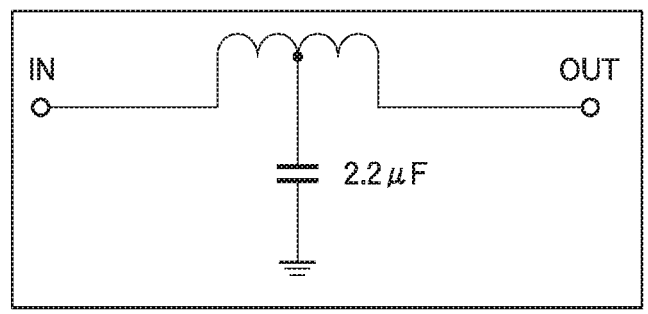
FIG. 15B is an equivalent circuit diagram of the same noise filter.

The filter device 20 may be similar to the one shown in FIGS. 13A and 13B. The filter device 20 includes the device unit 20a in which at least one capacitor is provided, the input side lead wire 20b extending from the device unit 20a, the output side lead wire 20c extending from the device unit 20a, and a grounding terminal extending from the device unit 20a. The lead wire 20b and the lead wire 20c are connected to the input terminal and the output terminal of the target device to which the noise filter is connected, respectively, and the grounding terminal 20d is used in a state of being connected to the ground terminal of the target device.

Figure 3:
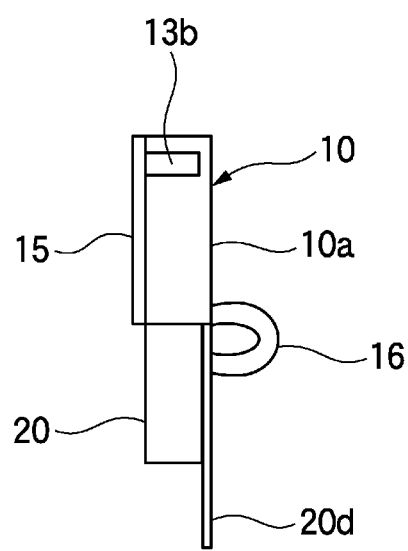
FIG. 3 is a side view of the noise filter of FIG. 2.

The protector 10 has a rectangular bottom wall 10a, which may be in a form of a thin plate, and side walls 10b, 10c, 10d, 10e extending perpendicularly from the periphery of the bottom wall 10a. A hollow space surrounded by the bottom wall 10a and the side walls 10b, 10c, 10d, 10e is formed inside the protector 10. This space can be closed by placing a cover 15 on the protector 10 as shown in FIG. 3. A fixing clamp 16 is provided on the outer surface of the bottom wall 10a, and by this fixing clamp 16 being inserted into a hole provided on a side of the target device, the protector 10 is attached to the target device.

In a central portion of the side wall 10d, a device fitting portion 11 (an example of a fixing portion) is formed. The device fitting portion 11 has a device receiving space 11a surrounded by side walls 11b, 11c, 11d. The device receiving space 11a is formed in a size equivalent to the width and thickness of the device unit 20a. Therefore, a part (that is, the device unit 20a) of the filter device 20 can be inserted and fixed in the device receiving space 11a. Through the side walls 11c, 11d of the device fitting portion 11, openings (through holes) 11e and 11f for passing the lead wire 20b and the lead wire 20c are formed, respectively. The lead wire 20b and the lead wire 20c are drawn out to the outside of the protector 10 through the opening 11e.

On the bottom wall 10a, four protrusions 12A, 12B, 12C, 12D are formed so as to be arranged side by side in a row at regular intervals in a direction parallel to the direction of the side wall 10b. The four protrusions 12A, 12B, 12C, 12D (an example of a holding structure) are cylindrical in the example of FIG. 1.

Through the side wall 10b, four lead wire draw-out openings (through holes) 13c, 13d, 13e, 13f are formed in positions opposed to the protrusions 12A, 12B, 12C, 12D, respectively. Through the side wall 10c, a lead wire draw-out opening 13a is formed in a position opposed to the protrusion 12A, and through the side wall 10e, a lead wire draw-out opening 13b is formed in a position opposed to the protrusion 12D. The size of each of the lead wire draw-out openings 13a, 13b, 13c, 13d, 13e, 13f is slightly larger than the diameter of the lead wires 20b, 20c.

Figure 2:
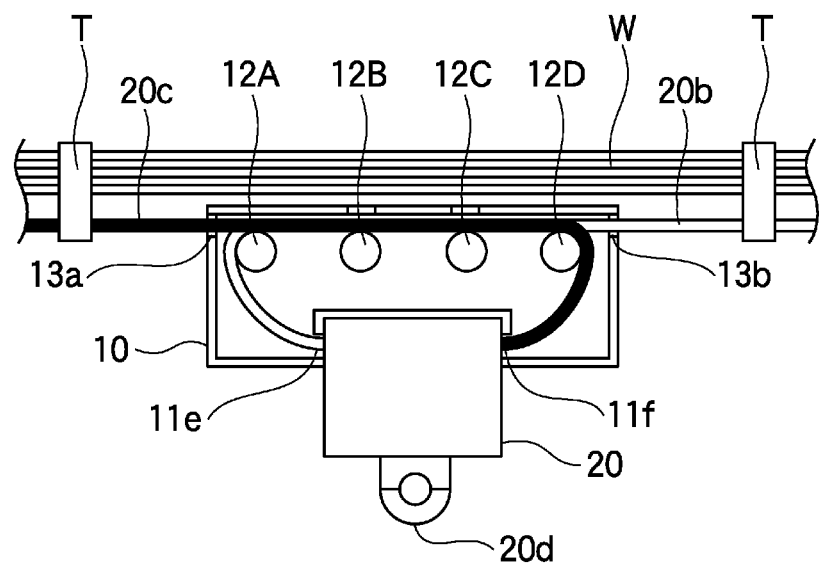
FIG. 2 is a longitudinal cross-sectional view of a first example of the noise filter.

A first example of the noise filter according to the present invention is shown in FIG. 2. FIG. 3 is a side view of the noise filter of FIG. 2.

In the first example of FIGS. 2 and 3, the lead wire 20c of the filter device 20 is passed through the opening 11f, guided along the periphery of the protrusion 12D so as to be bent approximately halfway around it in a counterclockwise direction, and further guided by the peripheries of the protrusion 12C, the protrusion 12B and the protrusion 12A so as to linearly extend leftward and drawn out to the outside from the lead wire draw-out opening 13a.

The lead wire 20b of the filter device 20 is passed through the opening 11e, guided along the periphery of the protrusion 12A so as to be bent approximately halfway around it in a clockwise direction, and further guided by the peripheries of the protrusion 12B, the protrusion 12C and the protrusion 12D so as to linearly extend rightward and drawn out to the outside from the lead wire draw-out opening 13b.

Thus, in the first example of FIG. 3, the lead wire 20c and the lead wire 20b are disposed in a state of being close to each other in the area between the left end of the protrusion 12A and the right end of the protrusion 12D. That is, the length of the area where the lead wire 20c and the lead wire 20b are close to each other is approximately three times the formation pitch PH (see FIG. 1) of the four protrusions 12A, 12B, 12C, 12D.

In the overlapping section where the lead wire 20c and the lead wire 20b are closely opposed to each other, a mutual inductance is generated therebetween. The degree of coupling of the mutual inductance changes in accordance with the length of the overlapping section where the lead wires 20b, 20c are closely opposed to each other. Thai, when it is converted into a numerical value with reference to the formation pitch PH of the protrusions 12A, 12B, 12C, 12D, the degree of coupling is approximately three times. Therefore, here, the coupling coefficient of mutual induction in the first example is represented as "K3".

The lead wire 20b and the lead wire 20c of the filter device 20 have their outsides coated with an electrically insulating material (for example, resin). However, the lead wire 20b and the lead wire 20c may be uncoated conductors. In that case, at least in the overlapping section where the lead wire 20b and the lead wire 20c are close to each other, an insulating material is disposed therebetween in order that they are not electrically in contact with each other. The protector 10 is made of an electrically insulating material like resin.

When attaching the noise filter of the first example of FIGS. 2 and 3 to a harness W, as shown in FIG. 2, a portion of the lead wire 20b and a portion of the lead wire 20c that are disposed outside the protector 10 are bundled together with a plurality of electric wires forming the harness W by, for example, tapes T. More specifically, the portion of the lead wire 20b located farther away from the device unit 20a than the overlapping section where the lead wire 20c and the lead wire 20b are closely opposed to each other is tied to the electric wires of the harness W. The portion of the lead wire 20c located farther away from the device unit 20a than the overlapping section where the lead wire 20c and the lead wire 20b are closely opposed to each other is tied to the electric wires of the harness W. By attaching the noise filter to the harness W in this manner, when the noise filter is mounted on a vehicle, movement of the device unit due to vibrations of the vehicle can be suppressed. In this example, the harness W, the lead wire 20b and the lead wire 20c are bundled by the tapes to attach the noise filter to the harness W. The harness W, the lead wire 20b and the lead wire 20c may be bundled instead by a fastening tool such as a tying band. Alternatively, instead of attaching the noise filter to the harness W through the harness W, the lead wire 20b and the lead wire 20c, the protector 10 may be directly attached to the harness W. In this case, an elongated tying band is provided to the protector 10, and the tying band is attached so as to be wound around the harness W.

Figure 4:
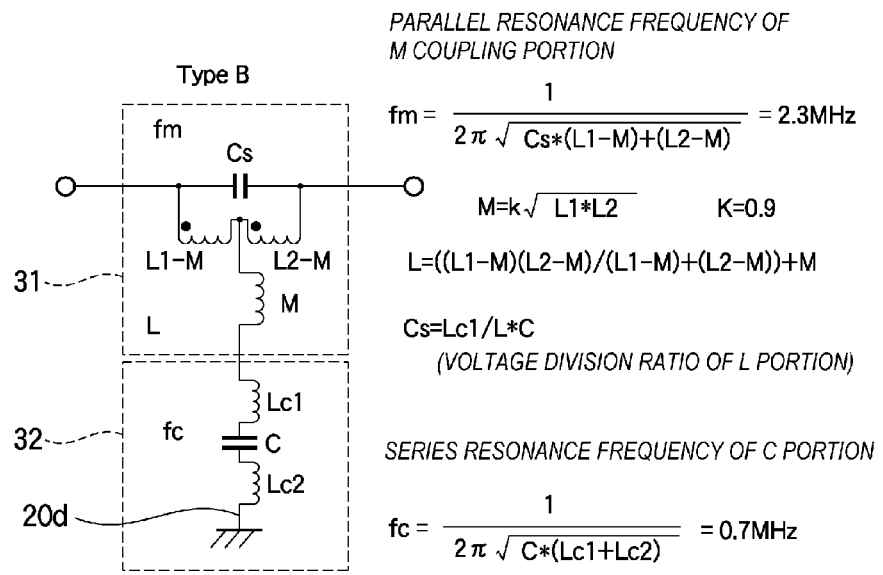
FIG. 4 is an equivalent circuit diagram of the noise filter of FIG. 2.

An equivalent circuit of the electric circuit in the noise filter shown in FIG. 2 is shown in FIG. 4. That is, when the functional structure of the noise filter shown in FIG. 2 is considered, it may be divided into an M coupling portion 31 and a C portion 32 as shown in FIG. 4.

The M coupling portion 31 of FIG. 4 is configured as a parallel resonance circuit affected by the mutual inductance (M) of the inductance of the lead wire 20b and the inductance of the lead wire 20c. The resonance frequency fm of this parallel resonance circuit is represented as follows.

$$fm = 1/\{2\pi\sqrt{(Cs \cdot ((L1-M)+(L2-M)))}\}$$

fm ≈ 2.3 [MHz]
L1: self-inductance [H] of lead wire 20b
L2: self-inductance [H] of lead wire 20c
M: mutual inductance [H]

$$M = K3\sqrt{(L1 \times L2)}$$

K3: coupling coefficient ≈ 0.8
L: overall inductance [H] of M coupling portion 31, $$L = ((L1-M) \cdot (L2-M)/((L1-M)+(L2-M))) + M$$

Cs: equivalent electrostatic capacitance [F] (assumed to be determined by voltage division ratio between C and inductance)

$$Cs = (Lc1/L) \times C$$

C: electrostatic capacitance [F] of filter device 20.

The C portion 32 of FIG. 4 is configured as a series resonance circuit including the electrostatic capacitance C of the filter device 20 and residual inductances Lc1 and Lc2. The resonance frequency fc of this series resonance circuit is represented as follows.

$$fc = 1/\{2\pi\sqrt{(C \cdot (Lc1+Lc2))}\}$$

fc ≈ 0.7 [MHz]

Figure 5:
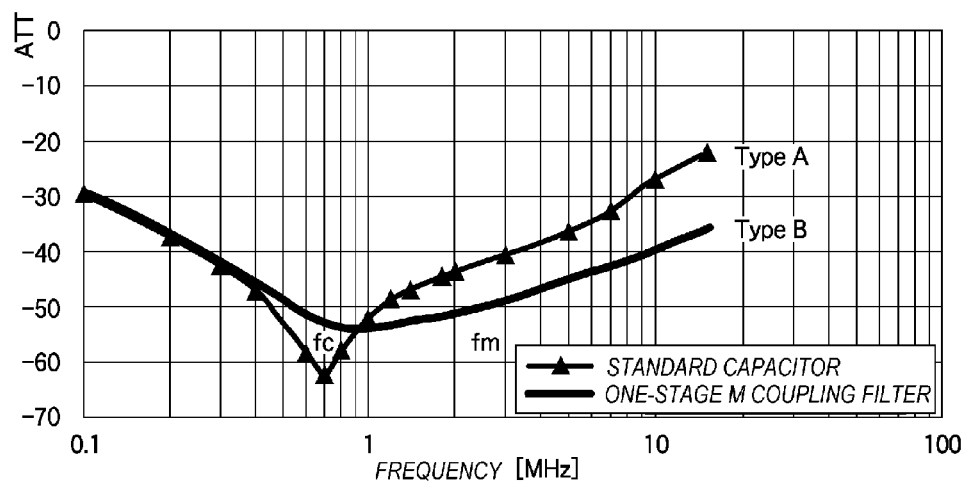
FIG. 5 is a graph showing frequency characteristics of two kinds of noise filters in comparison with each other.

The frequency characteristics of two kinds of noise filters are shown in FIG. 5 in comparison with each other. That is, "Type A" shown in FIG. 5 represents a frequency characteristic of the noise filter shown in FIGS. 13A and 13B, and "Type B" represents a frequency characteristic of the noise filter corresponding to the structure of FIG. 2 and the equivalent circuit shown in FIG. 4.

With the noise filter of "Type A" which is a trap filter by simple series resonance, the attenuation is large only in a comparatively narrow frequency band close to the resonance frequency fc as shown in FIG. 5. On the other hand, with the noise filter of "Type B" which has a structure where series resonance and parallel resonance are combined as shown in FIG. 4, a large attenuation is obtained in a wide frequency band including the two resonance frequencies fc and fm as shown in FIG. 5.

While only one frequency characteristic of the noise filter of "Type B" is shown in FIG. 5, a noise filter of a different frequency characteristic can be provided by changing the coupling coefficient (K3).

According to the noise filter having the protector 10 shown in FIG. 1, the configuration of the lead wire 20b and the lead wire 20c is fixed and the length of the overlapping section where they are closely opposed to each other can be maintained uniform. In other words, by specifying the wiring routes of the lead wire 20b and the lead wire 20c by using the four protrusions 12A, 12B, 12C, 12D, the configuration of the lead wire 20b and the lead wire 20c, particularly, the length of the overlapping section can be highly accurately reproduced. Therefore, the coupling coefficient (K3) hardly changes, and the noise filters are hardly affected by differences in work in the manufacturing process. Consequently, noise filters among which there are few individual differences and that have uniform frequency characteristics can be easily manufactured.

Moreover, according to the noise filter having the protector 10 shown in FIG. 1, the wiring routes of the lead wire 20b and the lead wire 20c can be switched by selectively using the protrusions 12A, 12B, 12C, 12D as described later. Moreover, the length of the overlapping section where the lead wire 20b and the lead wire 20c are closely opposed to each other can be switched by switching the routes of passage of the lead wire 20b and the lead wire 20c. Thereby, the coupling coefficient changes. That is, a plurality of kinds of noise filters having different frequency characteristics can be selectively structured.

Figure 6:
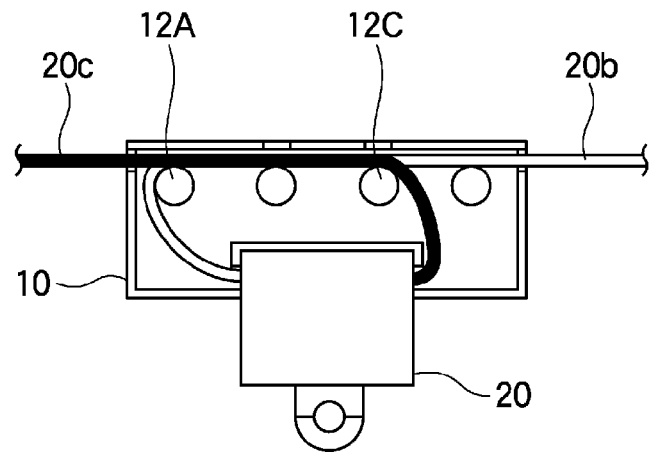
FIG. 6 is a longitudinal cross-sectional view of a second example of the noise filter.

The structure of the noise filter in a second example is shown in FIG. 6. The structure of FIG. 6 is a modification of the noise filter shown in FIG. 2, and is different in the wiring routes of the lead wire 20b and the lead wire 20c of the filter device 20.

In the noise filter of FIG. 6, the lead wire 20c of the filter device 20 is passed through the opening 11f, guided along the periphery of the protrusion 12C so as to be bent approximately halfway around it in a counterclockwise direction, and further guided by the peripheries of the protrusion 12B and the protrusion 12A so as to linearly extend leftward and drawn out to the outside from the lead wire draw-out opening 13a.

The lead wire 20b of the filter device 20 is passed through the opening 11e, guided along the periphery of the protrusion 12A so as to be bent approximately halfway around it in a clockwise direction, and guided by the peripheries of the protrusion 12B, the protrusion 12C and the protrusion 12D so as to linearly extends rightward and drawn out to the outside from the lead wire draw-out opening 13b.

Thus, in the second example of FIG. 6, the lead wire 20c and the lead wire 20b are disposed in a state of being closely opposed to each other in the area between the left end of the protrusion 12A and the right end of the protrusion 12D. That is, the length of the overlapping section where the lead wire 20c and the lead wire 20b are opposed to each other is approximately twice the formation pitch PH of the three protrusions 12A, 12B, 12C.

In the overlapping section where the lead wire 20c and the lead wire 20b are opposed to each other, a mutual inductance is generated therebetween. Since the degree of coupling of the mutual inductance changes according to the length of the overlapping section where the lead wires 20b, 20c are opposed, when it is converted into a numerical value with reference to the formation pitch PH of the protrusions 12A, 12B, 12C, the degree of coupling is approximately twice. Therefore, here, the coupling coefficient of mutual induction in the second example is represented as "K2".

The actual value of the coupling coefficient "K2" is about 0.5. Therefore, due to the coupling coefficient being different, the frequency characteristics of the noise filter shown in FIG. 6 are different from the frequency characteristics of the noise filter shown in FIG. 2.

Figure 7:
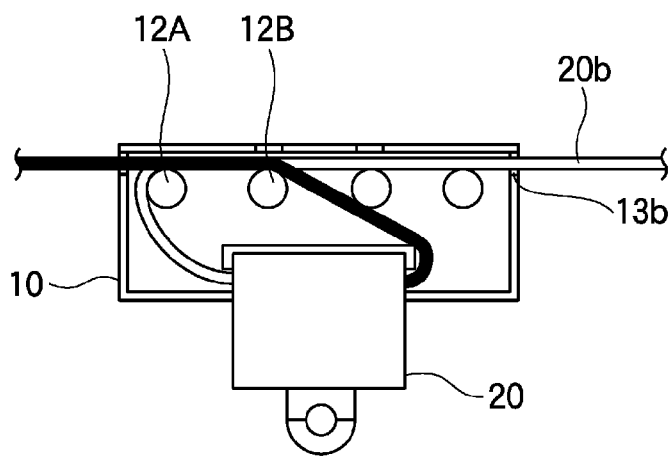
FIG. 7 is a longitudinal cross-sectional view of a third example of the noise filter.

The structure of the noise filter in a third example is shown in FIG. 7. The structure of FIG. 7 is a modification of the noise filter shown in FIG. 2, and is different in the wiring routes of the lead wire 20b and the lead wire 20c of the filter device 20.

In the noise filter of FIG. 7, the lead wire 20c of the filter device 20 passed through the opening 11f, guided along the periphery of the protrusion 12B so as to be bent approximately halfway around it in a counterclockwise direction, and further guided by the periphery of the protrusion 12A so as to linearly extend leftward and drawn out to the outside from the lead wire draw-out opening 13a.

The lead wire 20b of the filter device 20 is passed through the opening 11e, guided along the periphery of the protrusion 12A so as to be bent approximately halfway around it in a clockwise direction, and further guided by the peripheries of the protrusion 12B, the protrusion 12C and the protrusion 12D so as to linearly extend rightward and drawn out to the outside from the lead wire draw-out opening 13b.

Thus, in the third example of FIG. 7, the lead wire 20c and the lead wire 20b are disposed in a state of being closely opposed to each other in the area between the left end of the protrusion 12A and the right end of the protrusion 12B. That is, the length of the overlapping section where the lead wire 20c and the lead wire 20b are opposed to each other is approximately the same as the formation pitch PH of the two protrusions 12A, 12B.

In the area where the lead wire 20c and the lead wire 20b are close to each other, a mutual inductance is generated therebetween. Since the degree of coupling of the mutual inductance changes according to the length of the overlapping section where the lead wires 20b, 20c are opposed, when it is converted into a numerical value with reference to the formation pitch PH of the protrusions 12A, 12B, the degree of coupling is approximately one times. Therefore, here, the coupling coefficient of mutual induction in the third example is represented as "K1".

The actual value of the coupling coefficient "K1" is about 0.3. Therefore, due to the coupling coefficient being different, the frequency characteristics of the noise filter shown in FIG. 7 are different from the frequency characteristics of the noise filter shown in FIG. 2.

Figure 8:
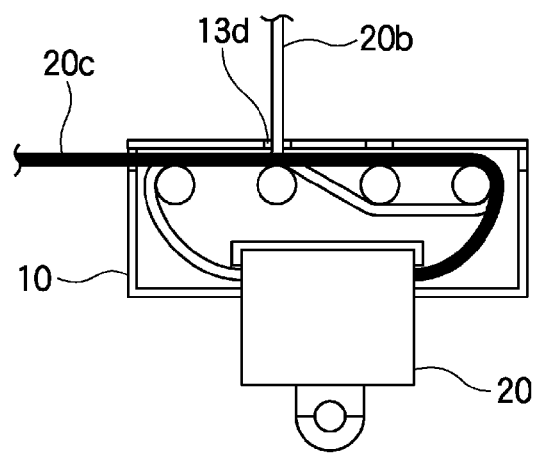
FIG. 8 is a longitudinal cross-sectional view of a fourth example of the noise filter.

The structure of the noise filter in a fourth example is shown in FIG. 8. The structure of FIG. 8 is a modification of the noise filter shown in FIG. 2, and is different in the wiring routes of the lead wire 20b and the lead wire 20c of the filter device 20.

In the noise filter of FIG. 8, the lead wire 20c of the filter device 20 is passed through the opening 11f, guided along the periphery of the protrusion 12D so as to be bent approximately halfway around it in a counterclockwise direction, and further guided by the peripheries of the protrusion 12C, the protrusion 12B and the protrusion 12A so as to linearly extend leftward and drawn out to the outside from the lead wire draw-out opening 13a in the horizontal direction.

The lead wire 20b of the filter device 20 is passed through the opening 11e, guided along the periphery of the protrusion 12A so as to be bent approximately halfway around it in a clockwise direction, and directed from above the protrusion 12B to below the protrusion 12C. Then, the lead wire 20b is directed rightward by way of the protrusion 12C, guided along the periphery of the protrusion 12D so as to be bent approximately halfway around the periphery of the protrusion 12D to be directed leftward, passed positions where the lead wire 20b abuts on upper parts of the protrusion 12C and protrusion 12B, and bent at 90 degrees to be drawn out to the outside from the lead wire draw-out opening 13d.

The lead wire 20b may be arranged along the following route. That is, the lead wire 20b of the filter device 20 is passed through the opening 11e, guided along the periphery of the protrusion 12A so as to be bent approximately halfway around it in a clockwise direction, and directed rightward by way of above the protrusion 12B, the protrusion 12C and the protrusion 12D. Then, the lead wire 20b is guided along the periphery of the protrusion 12D so as to be bent approximately halfway around it in a clockwise direction to be directed leftward, passed below the protrusion 12C and above the protrusion 12B, and bent at 90 degrees to be drawn out to the outside from the lead wire draw-out opening 13d.

Thus, in the fourth example of FIG. 8, the lead wire 20c and the lead wire 20b are disposed in a state of being closely opposed to each other in the area between the left end of the protrusion 12A and the right end of the protrusion 12D. That is, the length of the overlapping section where the lead wire 20c and the lead wire 20b are opposed to each other is approximately three times the formation pitch PH of the four protrusions 12A, 12B, 12C that the lead wires 20b, 20c pass. That is, in the noise filter of the fourth example of FIG. 8, the coupling coefficient is K3 as in the example of FIG. 2.

That is, by using the lead wire draw-out opening 13d instead of the lead wire draw-out opening 13b, the direction in which the lead wire 20b is drawn out to the outside of the protector 10 can be changed to the vertical direction.

Figure 9:
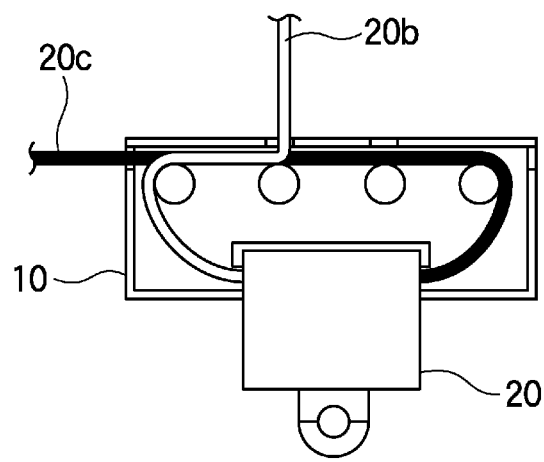
FIG. 9 is a longitudinal cross-sectional view of a fifth example of the noise filter.

The structure of the noise filter in a fifth example is shown in FIG. 9. The structure of FIG. 9 is a modification of the noise filter shown in FIG. 2, and is different in the wiring routes of the lead wire 20b and the lead wire 20c of the filter device 20.

In the noise filter of FIG. 9, the lead wire 20c of the filter device 20 is passed through the opening 11f, guided along the periphery of the protrusion 12D so as to be bent approximately halfway around it in a counterclockwise direction, and further guided by the peripheries of the protrusion 12C, the protrusion 12B and the protrusion 12A so as to linearly extend leftward and drawn out to the outside from the lead wire draw-out opening 13a in the horizontal direction.

The lead wire 20b of the filter device 20 is passed through the opening 11e, guided along the periphery of the protrusion 12A so as to be bent approximately halfway around it in a clockwise direction, passed above the protrusion 12B, and is then bent at 90 degrees to be drawn out to the outside from the lead wire draw-out opening 13d in the vertical direction.

Thus, in the fifth example of FIG. 9, the lead wire 20c and the lead wire 20b are disposed in a state of being closely opposed to each other in the area between the left end of the protrusion 12A and the neighborhood of the center of the protrusion 12D. That is, the length of the overlapping section where the lead wire 20c and the lead wire 20b are opposed to each other is approximately one times the formation pitch PH of the four protrusions 12A, 12B, 12C, 12D that the lead wires 20b, 20c pass. That is, in the noise filter of the fifth example of FIG. 9, the coupling coefficient is K1 as in the example of FIG. 7.

That is, by using the lead wire draw-out opening 13d instead of the lead wire draw-out opening 13b, the direction in which the lead wire 20b is drawn out of the protector 10 can be changed to the vertical direction.

Figure 10:
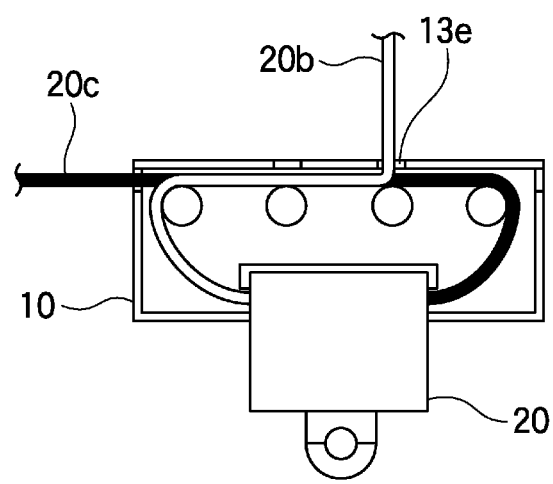
FIG. 10 is a longitudinal cross-sectional view of a sixth example of the noise filter.

The structure of the noise filter in a sixth example is shown in FIG. 10. The structure of FIG. 10 is a modification of the noise filter shown in FIG. 2, and is different in the wiring routes of the lead wire 20b and the lead wire 20c of the filter device 20.

In the noise filter of FIG. 10, the lead wire 20c of the filter device 20 is passed through the opening 11f, guided along the periphery of the protrusion 12D so as to be bent approximately halfway around it in a counterclockwise direction, and further guided by the peripheries of the protrusion 12C, the protrusion 12B and the protrusion 12A so as to linearly extend leftward and drawn out to the outside from the lead wire draw-out opening 13a in the horizontal direction.

The lead wire 20b of the filter device 20 is passed through the opening 11e, guided along the periphery of the protrusion 12A so as to be bent approximately halfway around it in a clockwise direction, passed above the protrusion 12B and the protrusion 12C, and is then bent at 90 degrees to be drawn out to the outside from the lead wire draw-out opening 13e in the vertical direction.

Thus, in the sixth example of FIG. 10, the lead wire 20c and the lead wire 20b are disposed in a state of being closely opposed to each other in the area between the left end of the protrusion 12A and the neighborhood of the center of the protrusion 12C. That is, the length of the overlapping section where the lead wire 20c and the lead wire 20b are opposed to each other is approximately twice the formation pitch PH of the four protrusions 12A, 12B, 12C, 12D that the lead wires 20b, 20c pass. That is, in the noise filter of the sixth example of FIG. 10, the coupling coefficient is K2 as in the example of FIG. 6.

That is, by using the lead wire draw-out opening 13e instead of the lead wire draw-out opening 13b, the direction in which the lead wire 20b is drawn out to the outside of the protector 10 can be changed to the vertical direction.

Figure 11:
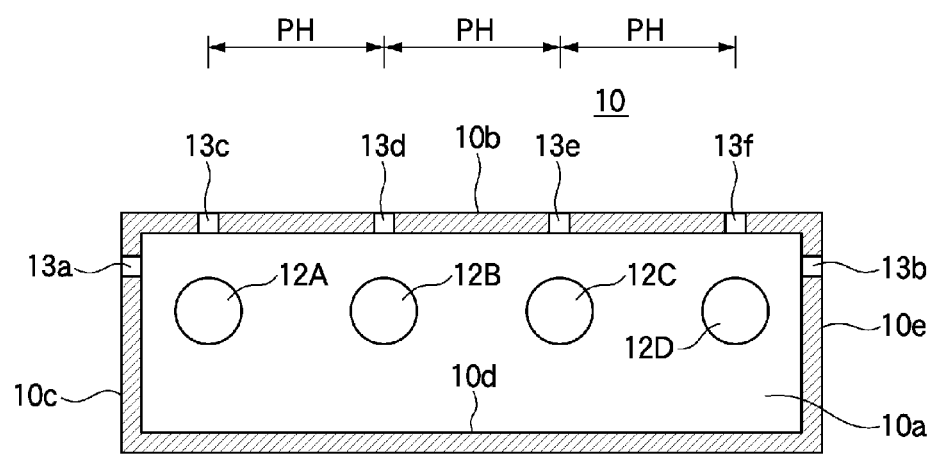
FIG. 11 is a longitudinal cross-sectional view illustrating a protector and a filter device of a noise filter according to another embodiment of the present invention.
Figure 11:
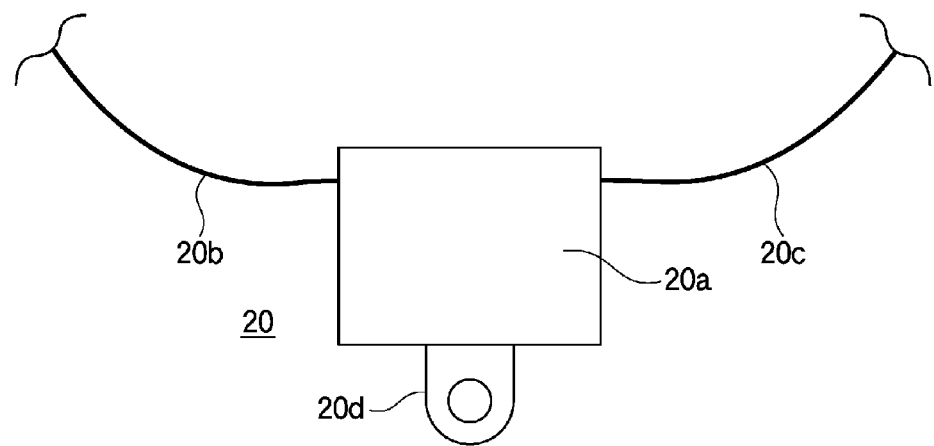

In the protector 10 shown in FIG. 1, the device fitting portion 11 is formed in a central portion of the side wall 10d, so that the device unit 20a of the filter device 20 can be inserted and fixed in the device receiving space 11a. In the case of this form, the device unit 20a can be surely fixed to the protector 10. However, this device fitting portion 11 is not indispensable for the present invention. FIG. 11 is a longitudinal cross-sectional view showing the structure of a protector and a filter device used by a noise filter of another embodiment. The protector 10 shown in FIG. 11 is configured such that a portion of the side wall 10c, a portion of the side wall 10e and the side walls 11b, 11c, 11d are removed from the protector 10 shown in FIG. 1 and such that, when the side walls 10b, 10c, 10d, 10e are viewed in a longitudinal cross-sectional view, the side walls 10b, 10c, 10d, 10e form a rectangular shape. In short, the protector 10 shown in FIG. 11 has a structure where the device fitting portion 11 is removed from the protector 10 shown in FIG. 1.

In the case of the protector 10 of the structure shown in FIG. 11, the lead wire 20b and the lead wire 20c are arranged, for example, along the following route: The lead wire 20b is inserted into the protector 10 from the lead wire draw-out opening 13a, bent around one or more than one of the protrusions 12A, 12B, 12C, 12D, and is drawn out to the outside of the protector 10 from one of the lead wire draw-out openings 13c, 13d, 13e, 13f. The lead wire 20c is inserted into the protector 10 from the lead wire draw-out opening 13b, bent around one or more than one of the protrusions 12A, 12B, 12C, 12D, and is drawn out to the outside of the protector 10 from one of the lead wire draw-out openings 13c, 13d, 13e, 13f. When the lead wire 20b and the lead wire 20c are arranged in this way, the device unit 20a of the filter device 20 is not directly fixed to the protector 10. However, since the lead wire 20b and the lead wire 20c are held in the protector 10 by the static frictional force acting on the lead wire 20b and the lead wire 20c arranged around the protrusions 12A, 12B, 12C, 12D, the device unit 20a connecting with the lead wire 20b and the lead wire 20c is also indirectly fixed to the protector 10 through the lead wire 20b and the lead wire 20c.

As described above, it is not essential to provide the protector 10 with a structure for fixing the device unit 20a. With such a protector 10, the structure is not complicated.

A special housing holding the device unit 20a may be separately provided in addition to the protector 10. A structure for attaching the special housing to the protector 10 is provided to the special housing and/or the protector 10, and when the noise filter is attached to the harness W, the device unit 20a is set in the special housing, the housing is attached to the protector 10 and the protector 10 is attached to the harness W.

While the four protrusions 12A, 12B, 12C, 12D are linearly arranged in a row in the example shown in FIG. 1, the arrangement may be changed to a different one. For example, it may be considered to arrange the protrusions 12A, 12B, 12C, 12D along a predetermined curved line. Moreover, the cross-sectional shape of the protrusions 12A, 12B, 12C, 12D may be other than circular, and the number of protrusions 12A, 12B, 12C, 12D may be increased or decreased.

Figure 12:
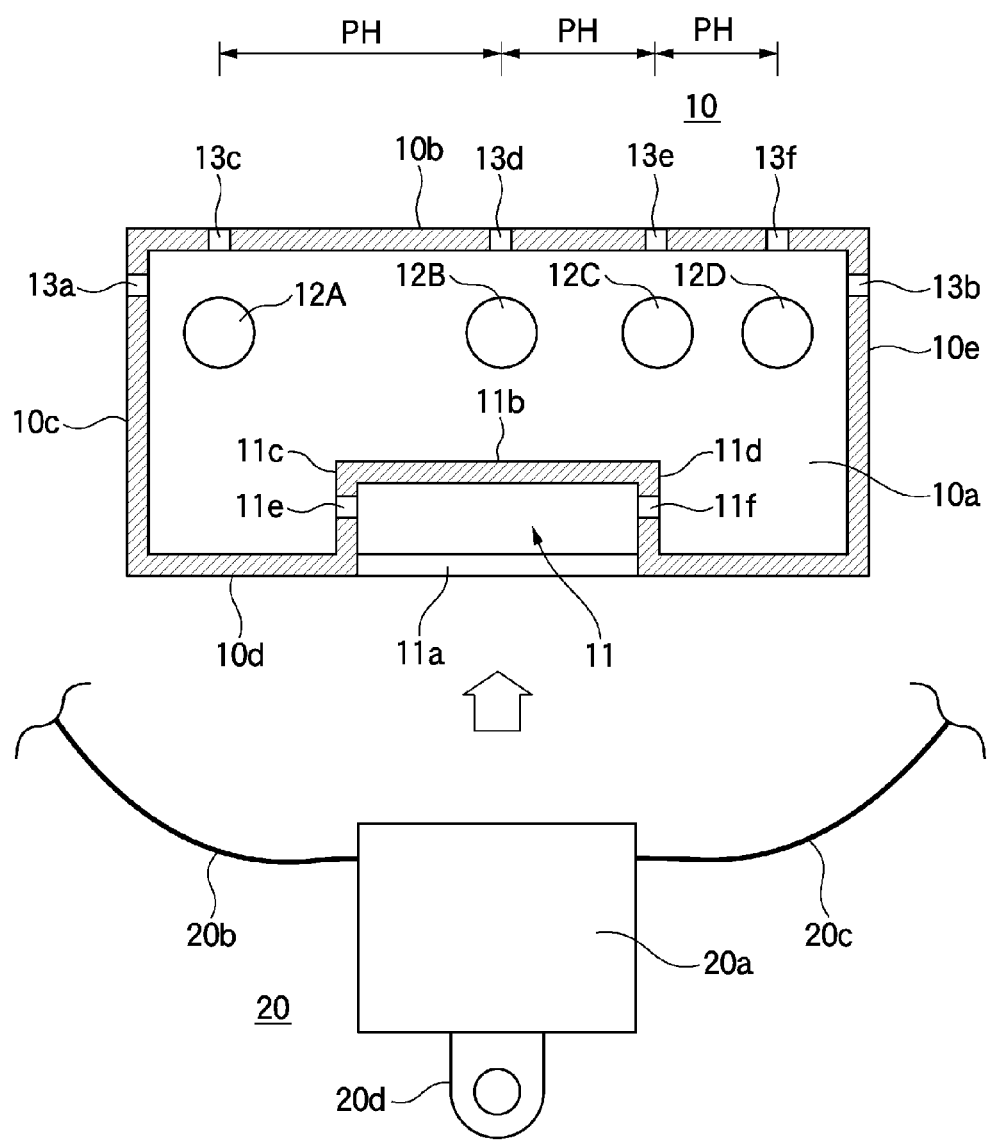
FIG. 12 is a longitudinal cross-sectional view illustrating a protector and a filter device of a noise filter according to yet another embodiment of the present invention.

While the four protrusions 12A, 12B, 12C, 12D are arranged in a row at regular intervals in the example shown in FIG. 1, they may be arranged at different intervals. FIG. 12 is a longitudinal cross-sectional view showing the structure of a protector and a filter device used by a noise filter of another embodiment. As shown in FIG. 12, the four protrusions 12A, 12B, 12C, 12D may be formed so as to be arranged in a row on the bottom wall 10a at different intervals in a direction parallel to the side wall 10b. More specifically, the interval between the protrusion 12A and the protrusion 12B is the largest, the interval between the protrusion 12B and the protrusion 12C is the second largest, and the interval between the protrusion 12C and the protrusion 12D is the smallest. This arrangement is merely one arrangement of the four protrusions 12A, 12B, 12C, 12D arranged at different intervals, and the arrangement of the protrusions 12A, 12B, 12C, 12D may be adjusted as appropriate. At this time, it is preferable to calculate the arrangement of the protrusions 12A, 12B, 12C, 12D in consideration of the wiring routes of the lead wire 20b and the lead wire 20c of the filter device 20 and the coupling coefficient.

Regarding the lead wire draw-out openings 13a to 13f, the total number thereof may be increased or decreased, and the locations thereof may be changed as required.

According one or more embodiments of the present invention, the arrangement of the lead wire 20b and the lead wire 20c is fixed, and the length of the overlapping section where these are closely opposed to each other can be held uniform. Therefore, as compared with a case in which the length of the overlapping section is adjusted by winding a tape, the mutual inductance between the lead wire 20b and the lead wire 20c can be set uniformly. Consequently, it becomes easy to provide uniform frequency characteristics of the noise filter.

In particular, by specifying the wiring routes of the lead wire 20b and the lead wire 20c by using the four protrusions 12A, 12B, 12C, 12D, the arrangement, particularly, the length of the overlapping section, of the lead wire 20b and the lead wire 20c can be reproduced with high accuracy. Consequently, noise filters with few individual differences and uniform frequency characteristics can be easily manufactured.

Moreover, in the noise filter having the protector 10 shown in FIG. 1, the wiring routes of the lead wire 20b and the lead wire 20c can be switched by selectively using the protrusions 12A, 12B, 12C, 12D. By switching the length of the overlapping section where the lead wire 20b and the lead wire 20c are closely opposed to each other by switching the routes of passage of the lead wire 20b and the lead wire 20c, a plurality of kinds of noise filters having different frequency characteristics can be selectively provided.

Moreover, whichever protrusions are selected as the protrusions along which the lead wire 20b and the lead wire 20c are bent, the length of the overlapping section can be set to the length equal to the distance between the protrusions along which the lead wires 20b, 20c are bent. Therefore, the length of the overlapping section can be made close to a predetermined designed value.

Moreover, the lead wire 20b and the lead wire 20c can be drawn out to the outside while maintaining their arrangement in the direction in which the protrusions 12A, 12B, 12C, 12D are arranged side by side. Therefore, the length of the overlapping section can be prevented from varying. Moreover, even when tension is applied to the lead wire 20b and the lead wire 20c from the outside, the length of the overlapping section can be prevented from changing, because frictional force is caused between the protrusions 12A, 12B, 12C, 12D and come parts of the lead wire 20b and the lead wire 20c.

According to illustrative aspects of the present invention, a noise filter and a harness are provided.

The noise filter includes a filter device (20) and a filter retainer (e.g., the protector 10). The filter device includes a device unit (20a) having at least one capacitor provided therein, an input side lead wire (20b) extending from the device unit, an output side lead wire (20c) extending from the device unit, and a ground connection portion (e.g., the grounding terminal 20d) provided on the device unit. The filter device forms the noise filter using a mutual inductance between the input side lead wire and the output side lead wire. The filter retainer includes a holding structure (e.g., the protrusions 12A, 12B, 12C, 12D) configured to maintain an arrangement of the input side lead wire and the output side lead wire, the arrangement forming an overlapping section in which the lead wires are closely opposed to each other.

The harness includes the noise filter described above and a set of electric wires (e.g., the harness W). A portion of the input side lead wire located farther away from the device unit than the overlapping section and a portion of the output side lead wire located farther away from the device unit than the overlapping section are tied to the set of electric wires.

According to the noise filter described above, the arrangement of the input side lead wire and the output side lead wire is fixed, and the length of the overlapping section where they are closely opposed to each other can be maintained uniform. Therefore, as compared with a case in which the length of the overlapping section is adjusted by winding a tape, the mutual inductance between the input side lead wire and the output side lead wire can be set uniformly. Consequently, it becomes easy to provide uniform frequency characteristics of the noise filter.

The filter retainer may further include a fixing portion (e.g., the device fitting portion 11) to which the device unit is fixed.

According to this configuration, the device unit can be firmly fixed to the filter retainer. Therefore, when the noise filter is mounted on a vehicle, movement of the device unit due to vibrations of the vehicle can be suppressed.

The holding structure may include at least three protrusions (12A, 12B, 12C, 12D) arranged side by side in a row, and the input side lead wire and the output side lead wire may be arranged so as to be bent along at least one of the protrusions.

According to this configuration, the input side lead wire and the output side lead wire are guided by the protrusions to take a predetermined route, and the input side lead wire and the output side lead wire are fixed such that there arrangement is maintained. Consequently, the length of the overlapping section where the input side lead wire and the output side lead wire are closely opposed to each other is also fixed, so that uniform noise removing characteristics can be provided and variations of the characteristics due to differences in work in the manufacturing process can be suppressed.

Moreover, the input side lead wire and the output side lead wire can be arranged such that the lead wires are bent along any of the protrusions. That is, in accordance with the required frequency characteristics, the length of the overlapping section can be selectively switched by changing the routes of passage of the input side lead wire and the output side lead wire. That is, only by switching the protrusions along which the input side lead wire and the output side lead wire are bet, noise filters of a plurality of kinds of characteristics can be manufactured in accordance with the required specifications.

The filter retainer may further include an input side opening (e.g., the lead wire draw-out openings 13a, 13b, 13c, 13d, 13e, 13f) from which the input side lead wire is drawn out to an outside of the filter retainer and an output side opening (e.g., the lead wire draw-out openings 13a, 13b, 13c, 13d, 13e, 13f) from which the output side lead wire is drawn out to the outside of the filter retainer. The input side opening and the output side opening may be formed so as to correspond to the protrusions, respectively.

According to this configuration, whichever protrusions are selected as the protrusions along which the input side lead wire and the output side lead wire are bent, the length of the overlapping section can be set to the length equal to the distance between the protrusions along which the lead wires are bent. That is, the length of the overlapping section can be made close to a predetermined designed value. Consequently, variations in the frequency characteristics of the noise filter can be reduced.

The input side lead wire may be drawn out from the input side opening in a first direction, and the output lead wire may be from the output side opening in a second direction, one of the first and second directions being substantially parallel to the direction in which the protrusions are arranged side by side, and the other of the first and second directions being substantially perpendicular to the direction in which the protrusions are arranged side by side.

According to this configuration, the input side lead wire and the output side lead wire can be drawn out to the outside while maintaining their arrangement in the direction in which the protrusions are arranged. Therefore, the length of the overlapping section can be prevented from varying. Moreover, even when tension is applied to the input side lead wire or the output side lead wire from the outside, the length of the overlapping section can be prevented from changing, because frictional force is caused between the protrusions and some parts of the input side lead wire or the output side lead wire.

What is claimed is:

1. A noise filter comprising:
a filter device comprising a device unit having at least one capacitor provided therein, an input side lead wire extending from the device unit, an output side lead wire extending from the device unit, and a ground connection portion provided on the device unit, the filter device forming the noise filter using a mutual inductance between the input side lead wire and the output side lead wire; and
a filter retainer comprising a holding structure configured to maintain an arrangement of the input side lead wire and the output side lead wire, the arrangement forming an overlapping section in which the input side lead wire and the output side lead wire are closely opposed to each other,
wherein the holding structure comprises at least three protrusions arranged side by side in a row, and
wherein the input side lead wire and the output side lead wire are arranged so as to be bent along at least one of the at least three protrusions.

2. The noise filter according to claim 1, wherein the filter retainer further comprises a fixing portion to which the device unit is fixed.

3. The noise filter according to claim 1, wherein the filter retainer further comprises an input side opening from which the input side lead wire is drawn out of the filter retainer and an output side opening from which the output side lead wire is drawn out of the filter retainer, and
wherein the input side opening and the output side opening are formed so as to correspond to the at least three protrusions, respectively.

4. The noise filter according to claim 3, wherein the input side lead wire is drawn out from the input side opening in a first direction and the output lead wire is drawn out from the output side opening in a second direction, one of the first direction and the second direction being parallel to a direction in which the at least three protrusions are arranged side by side, and the other of the first direction and the second direction being perpendicular to the direction in which the at least three protrusions are arranged side by side.

5. A harness comprising:
a noise filter configured to be mounted on a vehicle; and
a set of electric wires,
wherein the noise filter comprises:
a filter device comprising a device unit having at least one capacitor provided therein, an input side lead wire extending from the device unit, an output side lead wire extending from the device unit, and a ground connection portion provided on the device unit, the filter device forming the noise filter using a mutual inductance between the input side lead wire and the output side lead wire; and
a filter retainer comprising a holding structure configured to maintain an arrangement of the input side lead wire and the output side lead wire, the arrangement forming an overlapping section in which the input side lead wire and the output side lead wire are closely opposed to each other,
wherein a portion of the input side lead wire located farther away from the device unit than the overlapping section and a portion of the output side lead wire located farther away from the device unit than the overlapping section are tied to the set of electric wires, and
wherein the filter retainer further comprises a fixing portion to which the device unit is fixed.

6. A noise filter configured to be mounted on a vehicle, the noise filter comprising:
a filter device comprising a device unit having at least one capacitor provided therein, an input side lead wire extending from the device unit, an output side lead wire extending from the device unit, and a ground connection portion provided on the device unit, the filter device forming the noise filter using a mutual inductance between the input side lead wire and the output side lead wire; and
a filter retainer comprising a holding structure configured to maintain an arrangement of the input side lead wire and the output side lead wire, the arrangement forming an overlapping section in which the input side lead wire and the output side lead wire are closely opposed to each other,
wherein the filter retainer further comprises a fixing portion to which the device unit is fixed.

7. The noise filter according to claim 6, wherein the filter retainer has a rectangular cross section.

* * * * *